(12) United States Patent
von Kluge et al.

(10) Patent No.: US 9,054,041 B2
(45) Date of Patent: Jun. 9, 2015

(54) METHODS FOR ETCHING DIELECTRIC MATERIALS IN THE FABRICATION OF INTEGRATED CIRCUITS

(71) Applicant: GLOBALFOUNDRIES, Inc., Grand Cayman (KY)

(72) Inventors: Johannes von Kluge, Dresden (DE); Berthold Reimer, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 4 days.

(21) Appl. No.: 13/945,144

(22) Filed: Jul. 18, 2013

(65) Prior Publication Data

US 2015/0024578 A1    Jan. 22, 2015

(51) Int. Cl.
   *H01L 21/306*   (2006.01)
   *H01L 21/265*   (2006.01)
   *H01L 21/28*    (2006.01)

(52) U.S. Cl.
   CPC ............ *H01L 21/306* (2013.01); *H01L 21/265* (2013.01); *H01L 21/28* (2013.01)

(58) Field of Classification Search
   CPC ...... H01L 21/306; H01L 21/265; H01L 21/28
   USPC ........................ 438/514, 585, 494, 498, 504
   See application file for complete search history.

(56) References Cited

U.S. PATENT DOCUMENTS

| | | | | |
|---|---|---|---|---|
| 4,514,251 A | * | 4/1985 | van Ommen et al. | 438/526 |
| 6,100,172 A | * | 8/2000 | Furukawa et al. | 438/561 |
| 6,139,647 A | * | 10/2000 | Armacost et al. | 148/33.3 |
| 6,410,384 B1 | * | 6/2002 | Tseng | 438/249 |
| 2005/0202656 A1 | * | 9/2005 | Ito et al. | 438/514 |
| 2010/0025744 A1 | * | 2/2010 | Miyashita et al. | 257/288 |
| 2011/0198673 A1 | * | 8/2011 | Bonser et al. | 257/213 |

* cited by examiner

*Primary Examiner* — Peter Bradford
(74) *Attorney, Agent, or Firm* — Ingrassia Fisher & Lorenz, P.C.

(57) ABSTRACT

Methods for etching dielectric materials in the fabrication of integrated circuits are disclosed herein. In one exemplary embodiment, a method for fabricating an integrated circuit includes forming a layer of a first dielectric material over a gate electrode structure formed on a semiconductor substrate. The gate electrode structure includes a horizontal top surface and sidewall vertical surfaces adjacent to the horizontal top surface. The method further includes forming a layer of a second dielectric material over the layer of the first dielectric material. The first dielectric material is different than the second dielectric material. Still further, the method includes applying an etchant to the second material that fully removes the second material from the sidewall vertical surfaces while only partially removing the second material from the horizontal top surface and while substantially not removing any of the layer of the first dielectric material.

5 Claims, 4 Drawing Sheets

METHODS FOR ETCHING DIELECTRIC MATERIALS IN THE FABRICATION OF INTEGRATED CIRCUITS

TECHNICAL FIELD

The present disclosure generally relates to methods for fabricating integrated circuits. More particularly, the present disclosure relates to methods for etching dielectric materials in the fabrication of integrated circuits.

BACKGROUND

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode and spaced apart source and drain regions between which a current can flow. A control voltage applied to the gate electrode controls the flow of current through a channel between the source and drain electrodes. Complementary MOS (CMOS) devices include a plurality of N-channel MOS (NMOS) transistors and a plurality of P-channel (PMOS) transistors. The fabrication of advanced integrated circuits, such as CPUs, storage devices, ASICs (application specific integrated circuits) and the like, requires the formation of a large number of circuit elements in a given chip area according to a specified circuit layout, wherein field effect transistors (NMOS and PMOS transistors) represent one common type of circuit element used in manufacturing such integrated circuit devices.

Numerous processing operations are performed in a very detailed sequence, or process flow, to form such integrated circuit devices, e.g., deposition processes, etching processes, heating processes, masking operations, etc. In general, the formation of integrated circuit devices involves, among other things, the formation of various layers of material and patterning or removing portions of those layers of material to define a desired structure, such as a gate electrode, a sidewall spacer, etc. Etching processes, both wet and dry, are commonly employed to selectively etch one material relative to another material. Certain materials, especially dielectric materials, exhibit a relatively high etch selectivity relative to another material when both materials are exposed to the same etching process. For example, silicon nitride and silicon dioxide are two very common dielectric materials that may be selectively etched relative to one another using the appropriate etch chemistries, wherein the silicon nitride is removed and the silicon dioxide is only slightly etched, or vice versa. For example, silicon nitride may be selectively etched relative to silicon dioxide by performing a wet etching process using hot phosphoric acid as the etchant.

The formation and/or removal of sidewall spacers is a common situation where silicon nitride is etched relative to an underlying layer of silicon dioxide, or vice versa. In one example, a relatively thin silicon dioxide liner layer is formed over a gate electrode structure of a transistor and a silicon nitride layer is then formed on the silicon dioxide liner layer. In some process flows, it is desirable to remove the silicon nitride from top portions of the gate electrode structure to form a silicon nitride spacer structure. In other process flows, it is desirable to remove the silicon nitride from the sidewalls of the gate electrode structure while leaving the silicon nitride layer in place along horizontal surfaces of the gate electrode structure and the substrate. Regarding the former, many etching technologies are well-known in the art that allow for horizontal surfaces of the silicon nitride to be etched relative to the vertical surfaces, thereby forming the sidewall spacers. Regarding the latter, however, in order to etch the silicon nitride from the vertical sidewalls only, additional steps of depositing and patterning a masking layer over the horizontal surfaces must be used in order to prevent the silicon nitride from being etched form the horizontal surfaces at the same time as the sidewalls. These additional depositing/patterning steps require additional time, equipment, and expense to complete, thus increasing the overall cost of fabricating the integrated circuit.

Accordingly, it is desirable to provide improved methods for etching dielectric materials in the fabrication of integrated circuits. Furthermore, it is desirable to provide methods for etching one dielectric material selective to another dielectric material along vertical sidewalls of a gate electrode structure that do not require additional masking/patterning steps. Still further, other desirable features and characteristics of the present disclosure will become apparent from the subsequent detailed description and the appended claims, taken in conjunction with the accompanying drawings and the foregoing technical field and background.

BRIEF SUMMARY

Methods for etching dielectric materials in the fabrication of integrated circuits are disclosed herein. In one exemplary embodiment, a method for fabricating an integrated circuit includes forming a layer of a first dielectric material over a gate electrode structure formed on a semiconductor substrate. The gate electrode structure includes a horizontal top surface and sidewall vertical surfaces adjacent to the horizontal top surface. The method further includes forming a layer of a second dielectric material over the layer of the first dielectric material. The first dielectric material is different than the second dielectric material. Still further, the method includes applying an etchant to the layer of the second material that fully removes the layer of the second material from the sidewall vertical surfaces of the gate electrode while only partially removing the layer of the second material from the horizontal top surface of the gate electrode structure and while substantially not removing any of the layer of the first dielectric material.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

The embodiments described herein provide methods for etching dielectric materials disposed over a gate electrode structure. The methods remove a second dielectric material layer that overlies a first dielectric material layer from vertical sidewalls of the gate electrode structure, while leaving at least a portion of the second dielectric material in place overlying a horizontal top surface of the gate electrode structure, using a single etching process. The methods substantially avoid removing any of the first dielectric material from the vertical sidewalls. In this manner, the need for separate masking and patterning steps, as is known in the art, is avoided, thus reducing the time and expense required for fabricating integrated circuits.

Integrated circuits as provided herein may include a plurality of NMOS and/or PMOS transistors with or without conventional MOS transistors coupled together to implement a desired integrated circuit. Various steps in the manufacture of MOS transistors are well known and so, in the interest of brevity, many conventional steps will only be mentioned briefly herein or will be omitted entirely without providing the well-known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
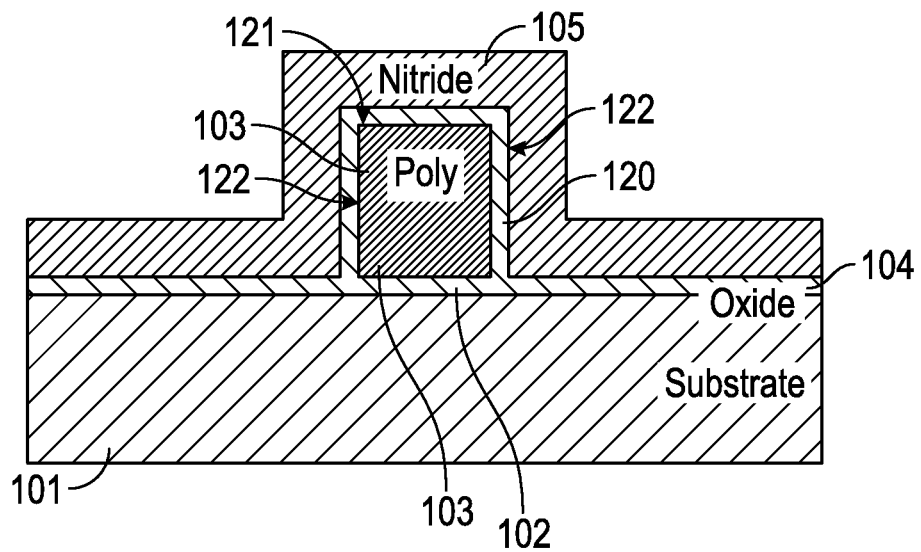
FIGS. 1-3 illustrate, in cross section, integrated circuit structures and methods for fabricating integrated circuit structures in accordance with some embodiments of the present disclosure.
Figure 2:
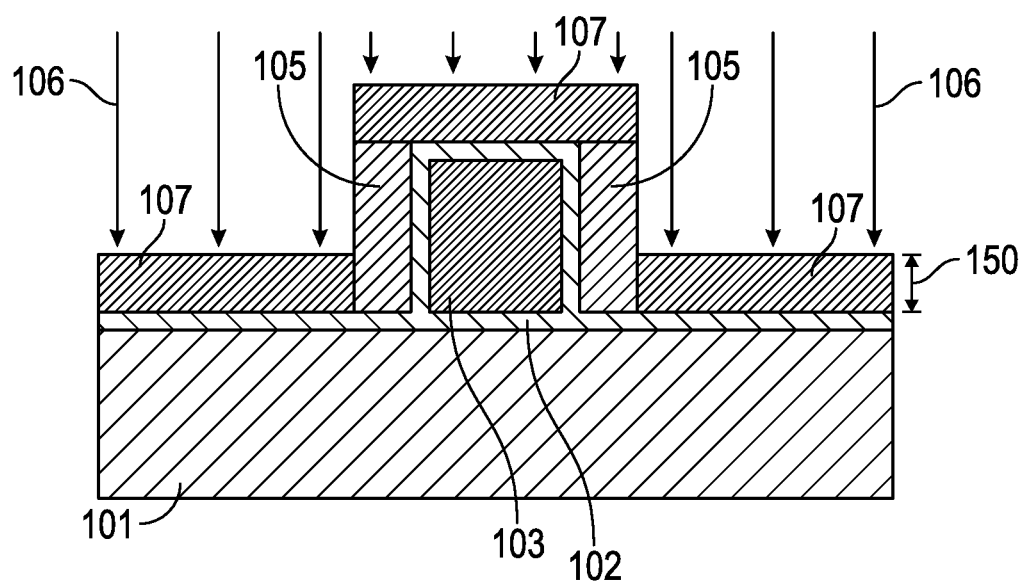
Figure 3:
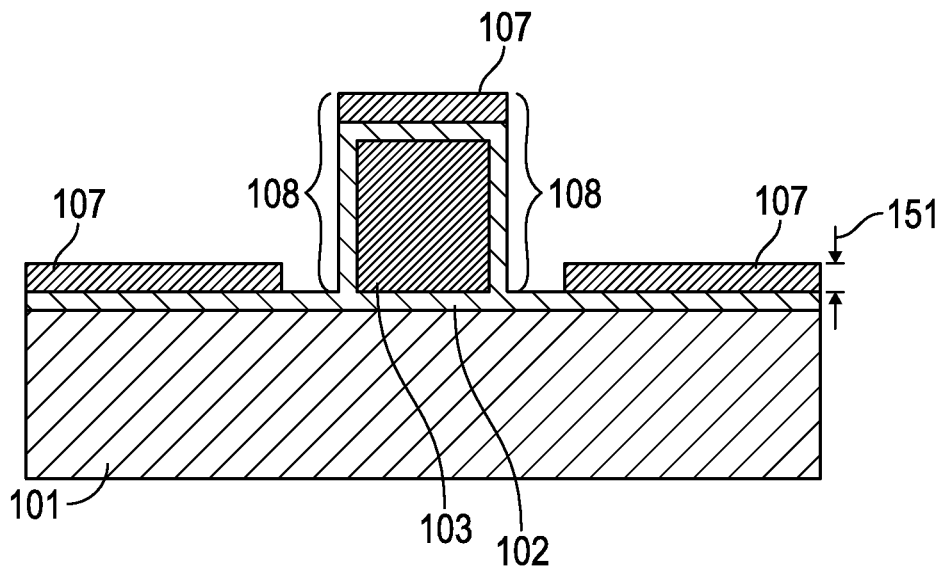

FIGS. 1-3 illustrate, in cross section, integrated circuit structures and methods for fabricating integrated circuit structures in accordance with some embodiments of the present disclosure. With particular reference to FIG. 1, the fabrication of an integrated circuit in accordance with an embodiment begins with providing a semiconductor substrate 101. The semiconductor substrate 101 is preferably a silicon substrate having a (100) surface crystal orientation, with the term "silicon substrate" being used herein to encompass the relatively pure silicon materials conventionally used in the semiconductor industry as well as silicon admixed with other elements such as germanium, carbon, and the like. Alternatively, the semiconductor substrate can be germanium, gallium arsenide, or other semiconductor material. Semiconductor substrate 101 will hereinafter be referred to for convenience but without limitation as a silicon substrate although those of skill in the semiconductor art will appreciate that other semiconductor materials may be used. Silicon substrate 101 may be a bulk silicon wafer (as illustrated), or it may be a thin layer of silicon on an insulating layer (commonly known as silicon-on-insulator or SOI) that, in turn, is supported by a carrier wafer. The silicon substrate 101 may be impurity doped with either N-type or P-type dopants.

Although FIG. 1 shows only one transistor in the process of fabrication, in some embodiments, isolation regions may be formed that extend through substrate 101 to electrically isolate a plurality of transistors from one another. The isolation regions are preferably formed by well-known shallow trench isolation (STI) techniques in which trenches are etched into silicon substrate 101, the trenches are filled with a dielectric material such as deposited silicon dioxide, and the excess silicon dioxide is removed by chemical mechanical planarization (CMP). STI regions provide electrical isolation, as needed, between various devices of the integrated circuit that are to be formed. Although STI regions are initially filled with a dielectric material such as silicon dioxide, especially for devices formed in very thin (less than 20 nm) silicon layers, much of that dielectric material may be removed as a consequence of the many etching steps that occur throughout the fabrication process.

As further shown in FIG. 1, a gate insulating layer 102 is formed on the surface of silicon substrate 101. The gate insulating layer 102 may be thermally grown silicon dioxide formed by heating the silicon substrate in an oxidizing ambient, or it may be a deposited insulator such as a silicon oxide, silicon nitride, a high dielectric constant insulator such as HfSiO, or the like. Deposited insulators may be deposited in a known manner, for example, by chemical vapor deposition (CVD), low pressure chemical vapor deposition (LPCVD), semi-atmospheric chemical vapor deposition (SACVD), or plasma enhanced chemical vapor deposition (PECVD). The gate insulator material is typically about 1 nm to about 10 nm in thickness.

A layer of a gate electrode forming material, for example polycrystalline silicon (referred to herein as "polysilicon"), is deposited onto the gate insulating layer 102 and the gate insulating layer 102 and the layer of gate electrode forming material are etched to form a gate electrode structure 103. The gate electrode structure includes vertically-oriented sidewalls 120 (that is, walls perpendicular to a surface 122 of the semiconductor substrate 101) and a horizontally-oriented top surface 121 (that is, a top surface 121 parallel to the surface 122 of the semiconductor substrate 101). Other electrically conductive gate electrode forming materials such as metals and metal silicides may also be deposited. The gate electrode forming material will hereinafter be referred to as polycrystalline silicon although those of skill in the art will recognize that other materials can also be employed. If the gate electrode material is polycrystalline silicon, that material is typically deposited to a thickness of about 50 nm to about 200 nm, for example to a thickness of about 100 nm by LPCVD using the hydrogen reduction of silane. The layer of polycrystalline silicon is deposited as un-doped polycrystalline silicon and may subsequently be impurity doped by ion implantation. As noted above, to form the gate electrode structure 103 as shown in FIG. 1, the polycrystalline silicon gate electrode forming material and the gate insulating layer 102 is patterned and etched. Patterning and etching includes the steps of depositing a patterned photoresist layer and etching according to the pattern, as is known in the art.

The fabrication method continues with the formation of one or more dielectric material layers. As was noted previously, dielectric material layers may be formed for spacing purposes, for masking purposes, and for alignment purposes, among others as are known in the art. As further shown in FIG. 1, a layer of a first dielectric material 104 is formed over the gate electrode structure 103 and over the silicon substrate 101. The first dielectric material may generally include any material that has electrical insulating properties, such as silicon dioxide or silicon nitride. In the example shown in FIG. 1, the first dielectric material is silicon dioxide. The illustrated layer 104 is deposited conformally, although in other embodiments the layer may be formed non-conformally, such as through non-conformal blanket deposition techniques. The layer of the first dielectric material 104 may be deposited in a known manner by, for example, atomic layer deposition (ALD), CVD, LPCVD, semi-atmospheric chemical vapor deposition (SACVD), or PECVD. In some embodiments, the layer of dielectric spacer material is deposited to a thickness of about 5 nm to about 50 nm.

Thereafter, a layer of a second dielectric material 105 is formed over the layer of the first dielectric material 104. The second dielectric material may generally include any material that has electrical insulating properties, such as silicon dioxide or silicon nitride. In the example shown in FIG. 1, the second dielectric material is silicon nitride. The illustrated layer 105 is deposited conformally, although in other embodiments the layer may be formed non-conformally. The layer of the second dielectric material 105 may be deposited in a known manner by, for example, atomic layer deposition (ALD), CVD, LPCVD, semi-atmospheric chemical vapor deposition (SACVD), or PECVD. In some embodiments, the layer of dielectric spacer material is deposited to a thickness, indicated by double-headed arrow 150, of about 5 nm to about 100 nm.

With reference now to FIG. 2, the exemplary method continues with exposing the integrated circuit, and in particular the layer of the first dielectric material 105, to a dopant ion implantation process. The layer 105 is exposed to an ionizing environment with an ionic dopant species (indicated by arrows 106) that is directed downward towards the integrated circuit. Suitable dopants for this process may include the various ions of boron (B), aluminum (Al), indium (In), phosphorus (P), arsenic (As), antimony (Sb), or a combination thereof. In one embodiment, the implanted ionic species is $As^+$. The ion implantation is performed wherein the ionizing source is directed at the integrated circuit at an angle 115 of approximately a ninety degree angle relative to the silicon substrate 101 such that horizontal surfaces of layer 105, such as those along the semiconductor substrate and those above the gate electrode structure 103, are implanted with the ionic dopant preferentially over vertical surfaces, such as those along sidewalls 120 of the gate electrode structure. Thus, areas 107 of layer 105 become doped with the ionic species, changing their chemical composition and reactivity.

Continuing the discussion of the exemplary method with regard to FIG. 3, an etchant, such as a wet etchant, is applied to the layer of the second dielectric material 105. Because of the differing chemical compositions of the horizontal portions of layer 105 that were preferentially implanted with the ionic species and the vertical portions of layer 105 that substantially avoided such implantation (due to the approximately ninety degree orientation (angle 115) of the ionic implantation process with respect to the silicon substrate 101), it has been discovered that the etchant will react at different rates with each respective portion. For example, it has been observed that the doped portions 107 of layer 105 are etched at a rate that is substantially slower as compared to non-doped portions of the same layer. Thus, as shown in FIG. 3, the application of a wet etchant causes the layer 105 to be substantially removed from regions 108 along the vertical sidewalls 120 of the gate electrode structure 103, while the doped portions 107 are only partially removed due to the slower etching rate. For example, a thickness, indicated by arrows 151, which is less than the original thickness 150 of layer 105, remains in portions 107 of layer 105. Further, as initially noted in the present application, the etchant may be provided so as to be selective to one of the dielectric materials over the other. In the example shown in FIG. 3, the etchant is provided so as to be selective to silicon nitride (layer 105) over silicon dioxide (layer 104). In one embodiment, a suitable wet etchant for such selective etching is hot, dilute hydrogen fluoride (HF) solution. As used herein with respect to the HF solution in this embodiment, the term "hot" refers to a temperature from about 40° C. to about 100° C., such as from about 60° C. to about 80° C. As further used herein with respect to the HF solution in this embodiment, the term "dilute" refers to an HF solution having a molar concentration from about 0.005 to about 0.01, such as from about 0.007 to about 0.008.

Thus, as shown in FIG. 3, the exemplary method is capable of completely etching the vertically-oriented portions of the layer of the second dielectric material 105 while only partially etching the horizontally-oriented portions thereof, while substantially avoiding etching of the underlying layer of the first dielectric material 104, for example leaving the first dielectric material layer 104 substantially intact (as used herein, the term "substantially intact" refers to removing minimal if any material from the first dielectric material). The exemplary method does not require any masking or patterning steps to protect the horizontal portions prior to etching, and thus represents a substantial improvement in terms of fabrication time and expense over methods for performing the same etch known in the prior art.

Figure 4:
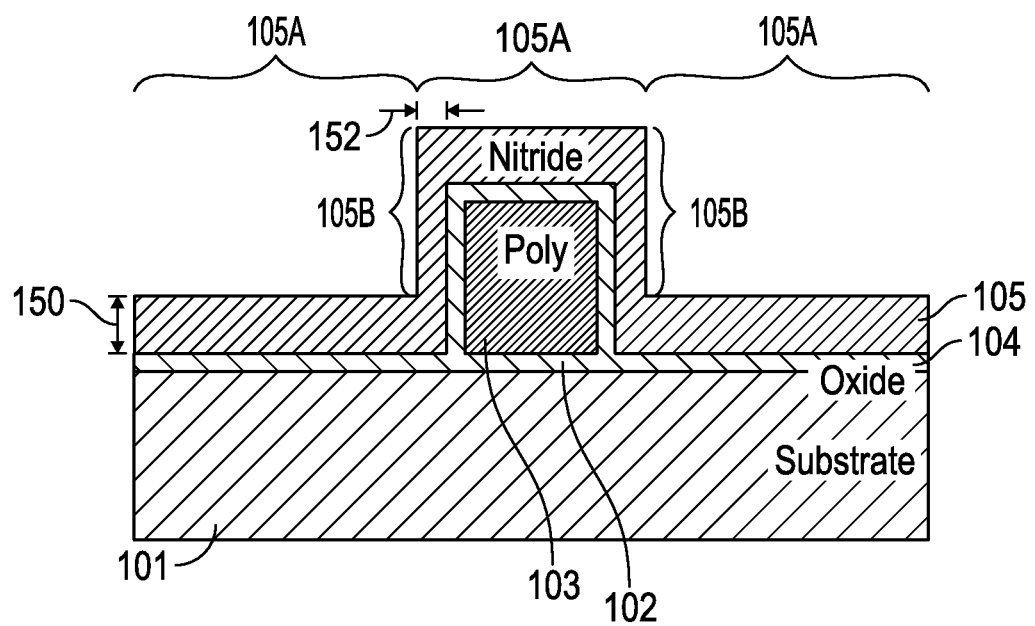
FIGS. 4-5 illustrate, in cross section, integrated circuit structures and methods for fabricating integrated circuit structures in accordance with other embodiments of the present disclosure.
Figure 5:
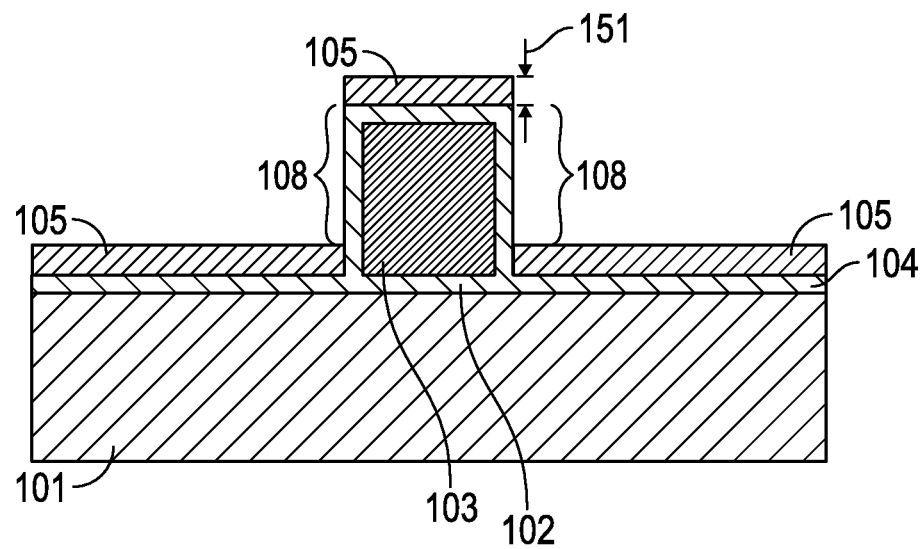

FIGS. 4-5 illustrate, in cross section, integrated circuit structures and methods for fabricating integrated circuit structures in accordance with other embodiments of the present disclosure. With particular reference to FIG. 4, a partially-formed integrated circuit is provided including the silicon substrate 101, the gate insulating layer 102, the gate electrode structure 103, and the silicon dioxide first dielectric material layer 104, substantially as described above with regard to FIG. 1. In this embodiment, however, the layer of the second dielectric material 105, for example the silicon nitride layer, is not deposited conformally, but is deposited using non-conformal techniques, such as non-conformal blanket deposition. The non-conformal layer of the second dielectric material 105 may be deposited in a known manner by, for example, CVD, LPCVD, semi-atmospheric chemical vapor deposition (SACVD), or PECVD. Through non-conformal deposition, the layer 105 generally includes two thickness regions: a first thickness region 105A, deposited along horizontally-oriented surfaces of the silicon substrate 101 and the top surface 121 of the gate electrode structure 103, having the thickness 150 as described above (a thickness of about 5 nm to about 100 nm); and a second thickness region 105B, deposited along vertically-oriented surfaces of the gate electrode structure 103 (i.e., the sidewalls 120), having a thickness 152 that is less than the thickness 150, such as about 0.8 times the thickness 150 or less, or about 0.6 times the thickness 150 or less.

Thereafter, with reference to FIG. 5, the etchant is applied to the layer of the second dielectric material 105 in the manner noted above with regard to FIG. 3. In this embodiment, however, there is no difference in chemical composition among the portions of layer 105, and as such the etch rate is substantially the same all across the layer 105. But, because portions 105B are thinner than portions 105A, the portions 105B are completely etched away, resulting in removed regions 108 along the vertical sidewalls 120 of the gate electrode structure 103 (as in FIG. 3), while at least a portion of the layer 105 in regions 105A (having the reduced thickness 151, show in FIG. 3) remains in place.

As in the previous embodiment, the etchant may be provided so as to be selective to one of the dielectric materials over the other. In the example shown in FIG. 5, the etchant is provided so as to be selective to silicon nitride (layer 105) over silicon dioxide (layer 104). In one embodiment, a suitable wet etchant for such selective etching is hot, dilute hydrogen fluoride (HF) solution. In another embodiment, a suitable wet etchant for such selective etching is hot phosphoric acid ($H_3PO_4$), which may be in solution. As used herein with respect to the HF solution in this embodiment, the term "hot" refers to a temperature from about 40° C. to about 100° C., such as from about 60° C. to about 80° C. As further used herein with respect to the HF solution in this embodiment, the term "dilute" refers to an HF solution having a molar concentration from about 0.005 to about 0.01, such as from about 0.007 to about 0.008. As used herein with respect to the $H_3PO_4$ etchant in this embodiment, the term "hot" refers to a temperature from about 100° C. to about 185° C. When in solution, the $H_3PO_4$ may have a molar concentration from about 50 to about 100.

Thus, as shown in FIG. 5, the exemplary method is capable of completely etching the vertically-oriented portions of the layer of the second dielectric material 105 while only partially etching the horizontally-oriented portions thereof, while substantially avoiding etching of the underlying layer of the first dielectric material 104, leaving material layer substantially intact. The exemplary method does not require any masking or patterning steps to protect the horizontal portions prior to etching, and thus represents a substantial improvement in terms of fabrication time and expense over methods for performing the same etch known in the prior art.

Figure 6:
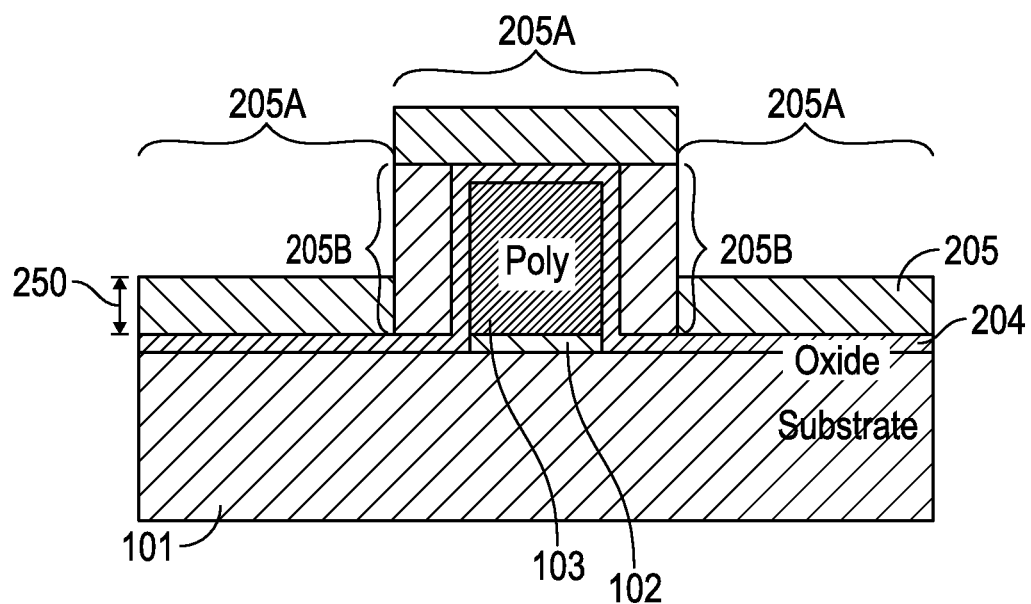
FIGS. 6-7 illustrate, in cross section, integrated circuit structures and methods for fabricating integrated circuit structures in accordance with further embodiments of the present disclosure.
Figure 7:
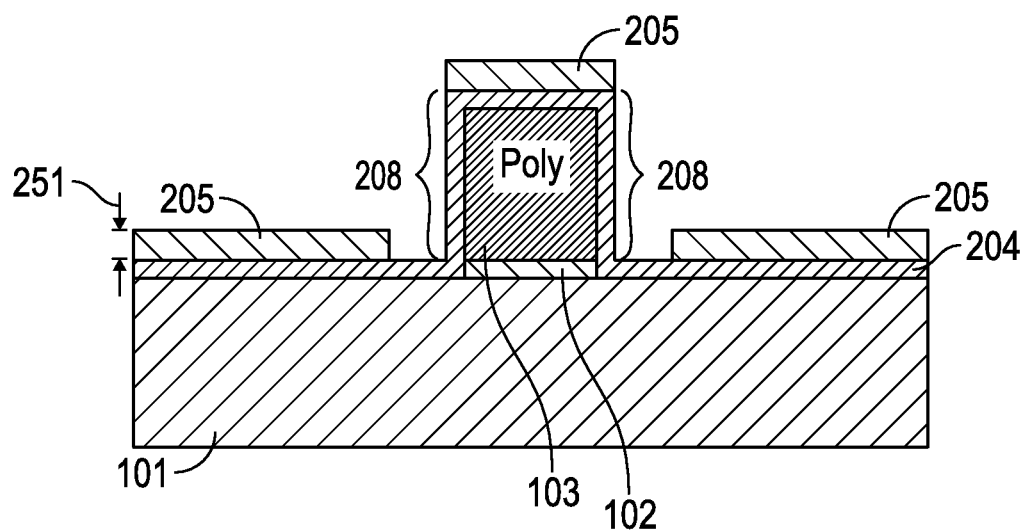

FIGS. 6-7 illustrate, in cross section, integrated circuit structures and methods for fabricating integrated circuit structures in accordance with further embodiments of the present disclosure. With particular reference to FIG. 6, a partially-formed integrated circuit is provided including the silicon substrate 101, the gate insulating layer 102, and the gate electrode structure 103. In this embodiment, however, a layer of a first dielectric material 204 may include silicon nitride, as opposed to silicon dioxide layer 104 in the previous embodiments, and a layer of a second dielectric material 205 may include silicon dioxide, as opposed to silicon nitride layer 105 in the previous embodiments. Layers 204 and 205 may be formed in any conventional manner, such as through atomic layer deposition (ALD), CVD, LPCVD, semi-atmospheric chemical vapor deposition (SACVD), or PECVD. Layers 204 and 205 may be deposited in a conformal or a non-conformal manner, although in the embodiment illustrated in FIG. 6, both layers 204 and 205 are deposited conformally.

As is known in the art, a silicon dioxide layer, such as second dielectric material layer 205, may be deposited such that various portions of the layer have different densities. In one example, under a variety of process conditions, when silicon oxide is deposited over a non-uniform surface using CVD, a so-called "shadowing" effect occurs wherein vertically-oriented portions of the layer that are disposed underneath horizontally-oriented portions of a layer (i.e., so-called "shadow" regions, such as those disposed along gate electrode sidewalls 120) are deposited having a lower density than the horizontally oriented portions. Shadowing is generally regarded in the art as undesirable, and thus efforts are commonly made to avoid such effects. As shown in FIG. 6, however, the shadowing effect is employed to deposit the silicon dioxide layer 205 so as to include two density regions: a first density region 205A, deposited along horizontally-oriented surfaces of the silicon substrate 101 and the top surface 121 of the gate electrode structure 103, having a first density; and a second density region 205B, deposited along vertically-oriented surfaces of the gate electrode structure 103 (i.e., the sidewalls 120), having a second density that is less than the first density, such as from about 0.5 to about 0.75 times the density of region 205A.

Thereafter, with reference to FIG. 7, the etchant is applied to the layer of the second dielectric material 205 in the manner noted above with regard to layer 105 in FIG. 3. In this embodiment, however, there is no difference in chemical composition among the portions of layer 105 (and there is no difference in thickness as in FIG. 5), and as such the etch rate is the same all across the layer 105. But, because portions 205B are less dense than portions 205A, the portions 205B are completely etched away, resulting in removed regions 208 along the vertical sidewalls 120 of the gate electrode structure 103 (as in FIG. 3), while at least a portion of the layer 205 in regions 205A (having a reduced thickness 251, as compared to the initial thickness thereof 250 (shown in FIG. 6)) remains in place.

As in the previous embodiments, the etchant may be provided so as to be selective to one of the dielectric materials over the other. In the example shown in FIG. 7, the etchant is provided so as to be selective to silicon dioxide (layer 205) over silicon nitride (layer 204). In one embodiment, a suitable wet etchant for such selective etching is hydrogen fluoride (HF) solution. As will be appreciated by those skilled in the art, HF, depending on temperature and concentration, is capable of providing different etching rates as applied to silicon nitride and silicon dioxide: if the concentration is relatively high, then it etches oxide selectively to nitride, as is commonly used in the semiconductor processing industry. If, however, the concentration is relatively low, HF etches nitride selectively to oxide and is additionally selective against dopant implants, such as $As^+$ as described above in the previous embodiment. With respect to the HF solution in this embodiment, the temperature is from about 20° C. to about 30° C., such as about 25° C. Further, in this embodiment, the solution of HF has a molar concentration from about 0.1 to about 5, such as about 2 to about 3.

Thus, as shown in FIG. 7, the exemplary method is capable of completely etching the vertically-oriented portions of the layer of the second dielectric material 205 while only partially etching the horizontally-oriented portions thereof, while substantially avoiding etching of the underlying layer of the first dielectric material 204. The exemplary method does not require any masking or patterning steps to protect the horizontal portions prior to etching, and thus represents a substantial improvement in terms of fabrication time and expense over methods for performing the same etch known in the prior art.

Although not illustrated, with regard to any of the embodiments described above, the partially-formed integrated circuit is completed in a conventional manner by, for example, implanting source/drain regions and providing electrical contacts to the source and drain regions and to the gate electrodes. This conventional processing may further include, for example, depositing interlayer dielectrics, etching contact vias, filling the contact vias with conductive plugs, and the like as are well known to those of skill in the art of fabricating integrated circuits. Additional post-processing may include the formation of one or more metal layers (M1, M2, etc.) and interlayer dielectric layers therebetween to complete the various electrical connections in the integrated circuit. The present disclosure is not intended to exclude such further processing steps as are necessary to complete the fabrication of a functional integrated circuit, as are known in the art.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating an integrated circuit comprising:
    forming a layer of a first dielectric material comprising silicon oxide over a gate electrode structure formed on a semiconductor substrate, the gate electrode structure comprising a horizontal top surface and sidewall vertical surfaces adjacent to the horizontal top surface;
    forming a layer of a second dielectric material comprising silicon nitride over the layer of the first dielectric material, wherein the first dielectric material is different in composition than the second dielectric material;
    implanting $As^+$ dopant ions into the layer of the second dielectric material; and
    after the implanting, applying an etchant to the layer of the second material that fully removes the layer of the second material from the sidewall vertical surfaces of the gate electrode while only partially removing the layer of the second material from the horizontal top surface of the gate electrode structure and while leaving the layer of the first dielectric material substantially intact, wherein applying the etchant comprises applying a solution of dilute hydrogen fluoride, and wherein applying the solution of dilute hydrogen fluoride comprises applying a solution of hydrogen fluoride at a molar concentration from about 0.005 to about 0.01 and a temperature from 40° C. to about 100° C.

2. The method of claim 1, wherein forming the layer of the first material comprises depositing the layer of the first material using chemical vapor deposition.

3. The method of claim 1, wherein forming the layer of the second material comprises depositing the layer of the second material using chemical vapor deposition.

4. The method of claim 1, wherein applying the etchant further comprises partially removing the layer of the second dielectric material from horizontal surfaces of the semiconductor substrate adjacent to the gate electrode structure.

5. A method for fabricating an integrated circuit comprising:
    conformally depositing a layer of a silicon dioxide over a gate electrode structure formed on a semiconductor substrate;
    conformally depositing a layer of silicon nitride over the layer of silicon dioxide;
    implanting $As^+$ dopant ions in the layer of silicon nitride at an approximately ninety degree angle relative to the semiconductor substrate;
    applying a hot, dilute HF etchant to the layer of the silicon nitride, the etchant having a temperature from about 60° C. to about 80° C. and a molar concentration of about 0.007 to about 0.008, the HF etchant being selective to the silicon nitride layer over the silicon dioxide layer.

* * * * *